(12) United States Patent
Honda et al.

(10) Patent No.: US 9,549,475 B2
(45) Date of Patent: Jan. 17, 2017

(54) DRIP-PROOF STRUCTURE OF ELECTRONIC APPARATUS

(71) Applicant: FANUC Corporation, Yamanashi (JP)

(72) Inventors: Yuuichi Honda, Yamanashi (JP); Kazuyuki Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/659,949

(22) Filed: Mar. 17, 2015

(65) Prior Publication Data
US 2015/0282340 A1 Oct. 1, 2015

(30) Foreign Application Priority Data

Mar. 25, 2014 (JP) .................. 2014-061725

(51) Int. Cl.
*H05K 5/00* (2006.01)
*H05K 5/06* (2006.01)
*H05K 7/14* (2006.01)

(52) U.S. Cl.
CPC .......... *H05K 5/0069* (2013.01); *H05K 5/0065* (2013.01); *H05K 5/069* (2013.01); *H05K 7/1467* (2013.01)

(58) Field of Classification Search
CPC .............................. H05K 5/069; H05K 5/0069
USPC ....................................... 439/76.2
See application file for complete search history.

(56) References Cited

U.S. PATENT DOCUMENTS

| 6,951,081 | B2 | 10/2005 | Bonshor | |
|---|---|---|---|---|
| 8,727,794 | B2* | 5/2014 | Tanaka | H05K 5/0039 361/752 |
| 2006/0089021 | A1* | 4/2006 | Kanamaru | B60R 16/0215 439/76.2 |
| 2007/0167040 | A1* | 7/2007 | Ogawa | H01R 13/6599 439/76.2 |
| 2008/0299800 | A1* | 12/2008 | Yoshida | H01R 13/5227 439/76.2 |
| 2009/0221160 | A1* | 9/2009 | Taniguchi | H02G 3/083 439/76.2 |
| 2010/0089638 | A1* | 4/2010 | Shinoda | H05K 5/069 174/564 |

(Continued)

FOREIGN PATENT DOCUMENTS

EP 0400150 A1 12/1990
JP H01-232800 A 9/1989

(Continued)

OTHER PUBLICATIONS

Office Action mailed Jul. 14, 2015, corresponding to Japanese patent application No. 2014-061725.

(Continued)

*Primary Examiner* — Hung V Ngo
(74) *Attorney, Agent, or Firm* — Hauptman Ham, LLP

(57) ABSTRACT

A housing for a module in which a printed circuit board is housed and a housing for a base unit in which a printed circuit board is housed are each provided with an opening for a connector, and a convex portion and/or a concave portion is provided around the connector opening so that a cutting fluid is prevented from dripping and spreading on the connector that electrically connects units such as the module and the base unit.

2 Claims, 5 Drawing Sheets

(56) References Cited

U.S. PATENT DOCUMENTS

| | | | | |
|---|---|---|---|---|
| 2010/0136805 A1* | 6/2010 | Maebashi | ........... | B60R 16/0238 |
| | | | | 439/76.2 |
| 2010/0151708 A1* | 6/2010 | Pascut | .................. | H01R 13/424 |
| | | | | 439/76.2 |
| 2012/0118771 A1 | 5/2012 | Kim et al. | | |
| 2012/0236479 A1* | 9/2012 | Tamai | ................ | B62D 5/0406 |
| | | | | 361/679.01 |
| 2013/0126229 A1* | 5/2013 | Chang | .................... | H05K 5/069 |
| | | | | 174/652 |
| 2014/0332263 A1* | 11/2014 | Sone | ...................... | H05K 5/065 |
| | | | | 174/551 |
| 2015/0098178 A1* | 4/2015 | Otake | ................ | G11B 33/1446 |
| | | | | 361/679.33 |

FOREIGN PATENT DOCUMENTS

| | | | |
|---|---|---|---|
| JP | 2002-16373 A | 1/2002 | |
| JP | 2005-347912 A | 12/2005 | |
| JP | 2006-75303 A | 3/2006 | |
| JP | 2008-106948 A | 5/2008 | |
| JP | 2013-123268 A | 6/2013 | |
| JP | 3185267 U | 8/2013 | |
| JP | 2013-182736 A | 9/2013 | |

OTHER PUBLICATIONS

Decision of Refusal in JP Application No. 2014-061725, mailed Dec. 8, 2015.

\* cited by examiner

DRIP-PROOF STRUCTURE OF ELECTRONIC APPARATUS

RELATED APPLICATIONS

The present application claims priority to Japanese Application Number 2014-061725, filed Mar. 25, 2014, the disclosure of which is hereby incorporated by reference herein in its entirety.

BACKGROUND OF THE INVENTION

Field of the Invention

The present invention relates to a drip-proof structure around connectors for unit connection of an electronic apparatus, in which a modularized unit configured so that a printed circuit board mounted with an electronic component and a connector is housed in a housing and a unit configured so that a printed circuit board mounted with an electronic component and a connector is secured to a housing are connected by the connectors for operation.

Description of the Related Art

A control panel of a machine tool will be described with reference to FIGS. 1 to 5.

As shown in FIG. 1, a numerical controller 1 is mounted on a housing of a control panel 2. An electronic apparatus such as an I/O unit 4 is mounted on an inner wall 13 of the control panel 2, as shown in FIG. 2, and is used in a severe factory environment in which a cutting fluid is used.

For such an electronic apparatus as the I/O unit 4, a user selects a plurality of modules 5 with different functions as required. During use, therefore, the electronic apparatus is unitized including a base unit 6 secured to the control panel 2 and the modules 5 removably connected to the base unit 6 by connectors (see Japanese Patent Application Laid-Open No. 1-232800).

In order to protect the interior of the control panel 2 from the factory environment, gaskets are disposed between the control panel 2 and an electronic apparatus such as the numerical controller 1 and in a cable inlet hole 3 opening into the control panel 2. Thus, outside air, cutting fluid, etc., are prevented from getting into the control panel 2.

If the gaskets are degraded by aging or a harsh environment in which a large amount of cutting fluid continues to be supplied, however, the cutting fluid may sometimes get into the control panel 2. In such a case, as shown in FIG. 3, the cutting fluid flows along the inner wall of the control panel 2 (see fluid flow 23).

As shown in FIGS. 4 and 5, a housing 7 for the modules 5 is formed with a module-side opening 14 to which a module-side connector 11 can be attached, and a housing 8 for the base unit 6 is formed with a base-unit-side opening 16 to which a base-unit-side connector 12 can be attached. Thus, a liquid, such as the cutting fluid, flows through the housing 7 for the modules 5 and the housing 8 for the base unit 6 of the I/O unit 4 and reaches the module-side connector 11 and the base-unit-side connector 12, which electrically connect the units, thereby causing problems, such as contact failure of the connectors 11 and 12.

SUMMARY OF THE INVENTION

Accordingly, in view of the above-described problems of the prior art, the object of the present invention is to provide a drip-proof structure (liquid infiltration preventing structure) around connectors for unit connection, capable of preventing a liquid, such as a cutting fluid, from dripping and spreading on the connectors that electrically connect units, such as modules and a base unit.

In a drip-proof structure of an electronic apparatus according to the present invention, a module configured so that a printed circuit board on which an electronic component and a connector are mounted is housed in a housing for the module and a base unit configured so that a printed circuit board on which an electronic component and a connector are mounted is secured to a housing for the base unit are connected for operation by the connectors provided to the module and the base unit, individually. The housing for the module and the housing for the base unit are each provided with a connector opening. And, at least one of the connector opening in the housing for the module and the connector opening in the housing for the base unit is provided with a drip-proof structure section formed of a convex portion and/or a concave portion that surround the opening.

The drip-proof structure may include a structure section configured to pressure-weld the drip-proof structure section of the housing for the module or the housing for the base unit to the housing for the base unit or the housing for the module opposite thereto or pressure-weld the drip-proof structure section of the housing for the base unit to the drip-proof structure section of the housing for the module.

The drip-proof structure section formed of the convex portion and/or the concave portion that surround the connector opening in the housing for the module or the housing for the base unit may be in the shape of a roof inclined downward so as to be kept apart from the connector opening, as viewed toward a mounting surface for the connector.

According to the present invention, there can be provided a drip-proof structure around connectors for unit connection, capable of preventing a liquid, such as a cutting fluid, from dripping and spreading on the connectors that electrically connect units, such as modules and a base unit.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Figure 3:
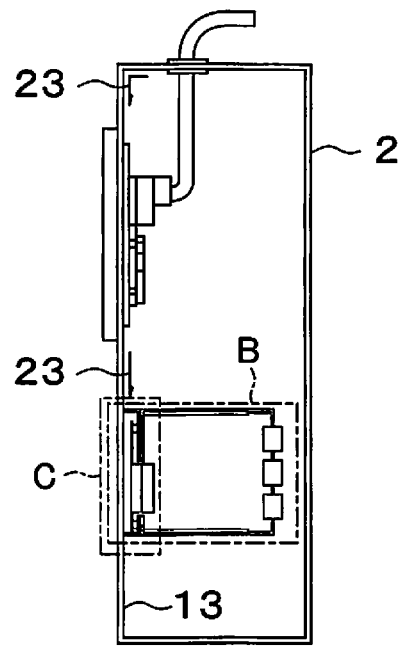
FIG. 3 is a sectional view taken along line A-A of FIG. 2.
Figure 6:
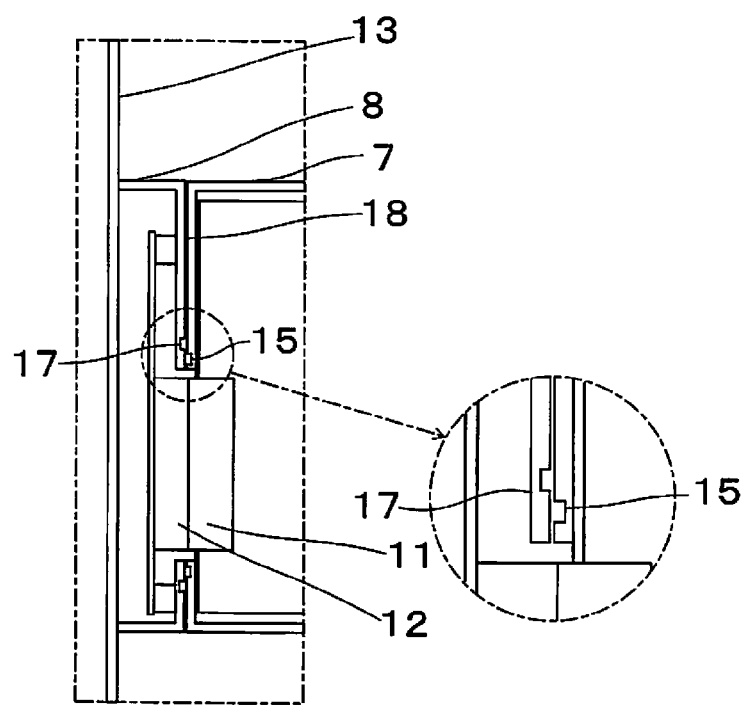
FIG. 6 is a view showing a first embodiment of a drip-proof structure according to the present invention applied to the portion C of the control panel shown in FIG. 3.

First, referring to FIG. 6, there will be described a case where a first embodiment of a drip-proof structure of an electronic apparatus according to the present invention is applied to a portion C of a control panel 2 shown in FIG. 3.

Figure 1:
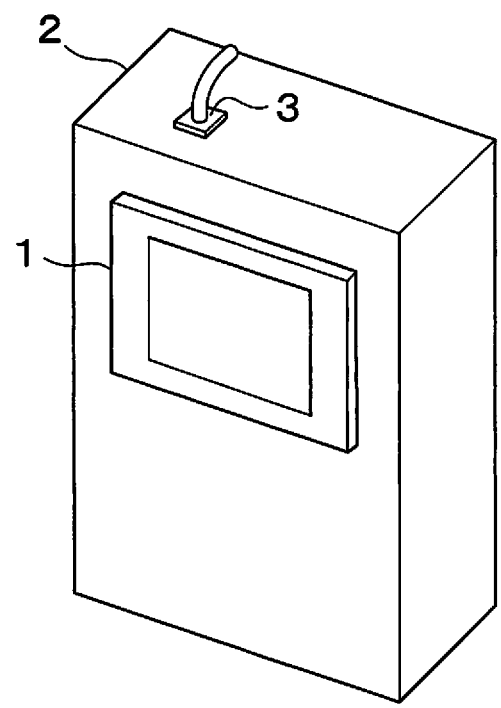
FIG. 1 is an external perspective view of a control panel of a machine tool.
Figure 2:
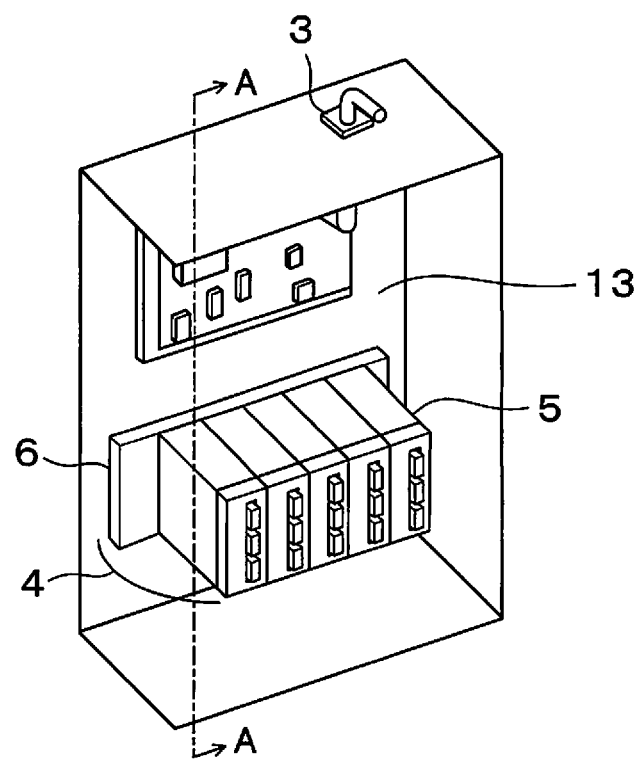
FIG. 2 is a view showing the interior of the control panel of FIG. 1.
Figure 4:
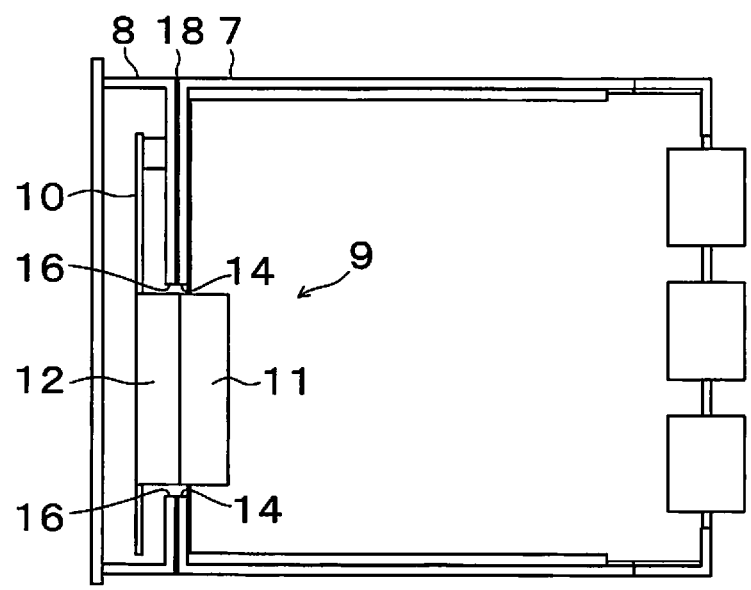
FIG. 4 is an enlarged view of a portion B of the control panel shown in FIG. 3.
Figure 5:
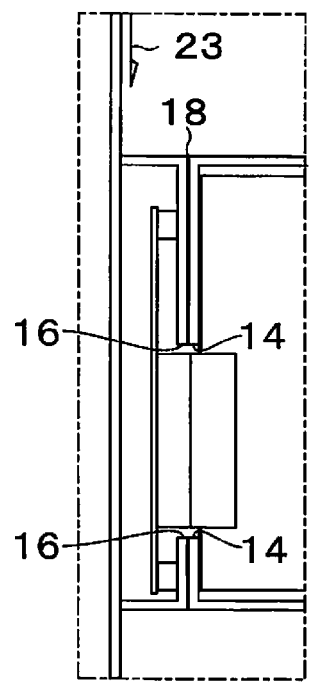
FIG. 5 is a detailed view of a portion C (prior art) of the control panel shown in FIG. 3.

As shown in FIG. 2, an I/O unit 4 comprises modules 5 and a base unit 6. As shown in FIG. 4, each of the modules 5 is configured so that a module-side printed circuit board 9 on which an electronic component and a module-side connector 11 are mounted is housed in a housing 7 for the modules 5 and modularized. The base unit 6, which is secured to a wall 13 of the control panel 2, is configured so that a base-unit-side printed circuit board 10 on which an electronic component and a base-unit-side connector 12 are mounted is housed in a housing 8 for the base unit 6. The module 5 and the base unit 6 are connected by the module-side connector 11 and the base-unit-side connector 12 and operate as the I/O unit 4.

The housing 7 for the modules 5 is provided with a module-side opening 14 for the module-side connector 11 and a drip-proof structure section 15 (FIG. 6) surrounding the module-side opening 14. As shown in FIG. 6, the drip-proof structure section 15 provided to the module 5 is formed as a convex portion protruding from a wall surface of the housing 7 for the modules 5 or a concave portion recessed from the wall surface. The drip-proof structure section 15 comprises the convex portion or the concave portion or both the convex portion and the concave portion. FIG. 6 shows an example in which the drip-proof structure section 15 provided to the module 5 is formed of a concave portion recessed from the wall surface of the housing 7 for the modules 5.

The drip-proof structure section 15 surrounding the module-side opening 14 serves to guide a liquid, such as a cutting fluid introduced into the control panel 2, along itself even when the liquid runs down the inner wall 13 of the control panel 2 through a gap 18 between the module 5 and the base unit 6. Thus, the drip-proof structure section 15 can prevent the liquid from dripping and spreading on the module-side connector 11.

The housing 8 for the base unit 6 is provided with a base-unit-side opening 16 for the base-unit-side connector 12 and a drip-proof structure section 17 surrounding the base-unit-side opening 16. The drip-proof structure section 17 provided to the base unit 6 is formed as a convex portion protruding from a wall surface of the housing 8 for the base unit 6 or a concave portion recessed from the wall surface. The drip-proof structure section 17 provided to the base unit 6 comprises the convex portion or the concave portion or both the convex portion and the concave portion. FIG. 6 shows an example in which the drip-proof structure section 17 provided to the base unit 6 is formed of a concave portion recessed from the wall surface of the housing 8 for the base unit 6.

The drip-proof structure section 17 surrounding the base-unit-side opening 16 serves to guide a liquid, such as the cutting fluid introduced into the control panel 2, along itself even when the liquid runs down the inner wall 13 of the control panel 2 through the gap 18 between the module 5 and the base unit 6. Thus, the drip-proof structure section 17 can prevent the liquid from dripping and spreading on the base-unit-side connector 12.

In order to facilitate the liquid flowing along the wall surface of the housing 7 for the modules 5 or the wall surface of the housing 8 for the base unit 6 to collect at corners of the drip-proof structure sections 15 and 17, the drip-proof structure sections provided to the housing 7 for the modules 5 and the housing 8 for the base unit 6 should preferably be formed having a rectangular cross-section. Further, the drip-proof structure sections provided to the wall surface of the housing 7 for the modules 5 and the wall surface of the housing 8 for the base unit 6 need not surround portions of the module-side opening 14 and the base-unit-side opening 16 on the downstream side of a fluid flow 23. In other words, the drip-proof structure sections are not limited to the configurations surrounding the entire circumferences of the openings 14 and 16.

Figure 7:
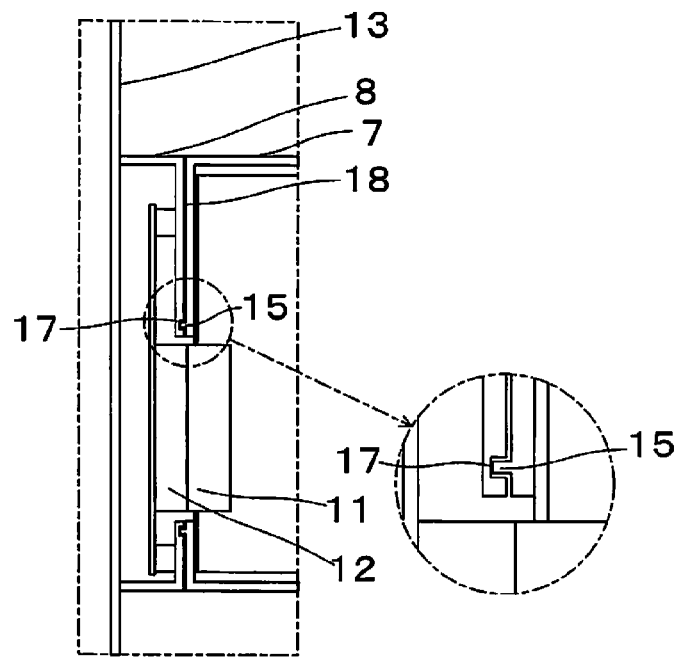
FIG. 7 is a view showing a second embodiment of the drip-proof structure according to the present invention applied to the portion C of the control panel shown in FIG. 3.

Referring now to FIG. 7, there will be described a case where a second embodiment of the drip-proof structure of an electronic apparatus according to the present invention is applied to the portion C of the control panel 2 shown in FIG. 3.

A module 5 or a base unit 6 is provided with means for pressure-welding a drip-proof structure section 15 provided to a housing 7 for the modules 5 and a drip-proof structure section 17 provided to a housing 8 for the base unit 6 to each other without a gap when the module 5 and the base unit 6 are connected by a module-side connector 11 and a base-unit-side connector 12. This pressure-welding means includes fixing means for bolting the module 5 to the base unit 6, means for locating the drip-proof structure section of the housing 7 for the modules 5 and the drip-proof structure section of the housing 8 for the base unit 6 so that they slightly interfere with each other and squeeze each other by the flexibility of the housings when the module 5 and the base unit 6 are connected by the connectors. Thus, there is no gap through which a liquid, such as a cutting fluid, is introduced, so that penetration of the liquid into the openings is more difficult than in the case where the drip-proof structure sections are only provided to surround the openings for the connectors.

As shown in FIG. 7, a convex portion is provided as the drip-proof structure section 15 on the housing 7 for the modules 5, a concave portion is provided as the drip-proof structure section 17 in the housing 8 for the base unit 6, and the convex portion and the concave portion are arranged so that they fit with each other. The housing 7 for the modules 5 and the housing 8 for the base unit 6 are tightly secured to each other by the pressure-welding means attached to the housing 7 and/or the housing 8. Thus, as the convex portion on the housing 7 for the modules 5 is tightly fitted in the concave portion in the housing 8 for the base unit 6, the liquid or the cutting fluid can be prevented from being transferred to the module-side connector 11 and the base-unit-side connector 12.

Figure 8:
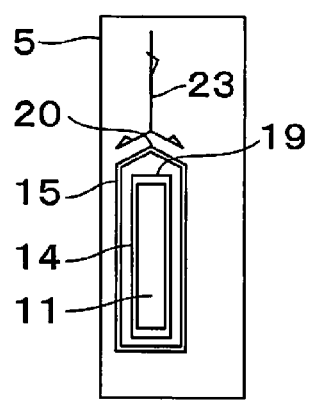
FIG. 8 is a view showing a third embodiment of the drip-proof structure according to the present invention applied to the module side of an I/O unit.
Figure 9:
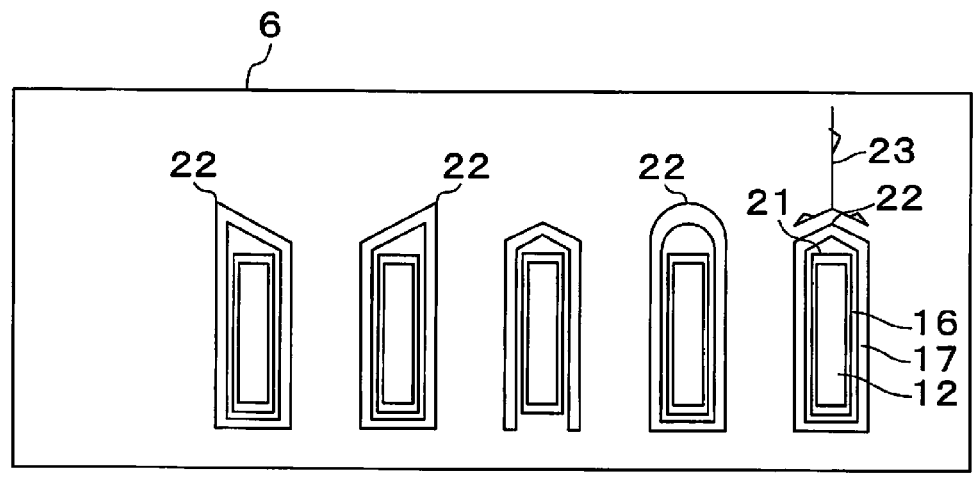
FIG. 9 is a view showing the third embodiment of the drip-proof structure according to the present invention applied to the base-unit side of the I/O unit.

A third embodiment of the drip-proof structure of an electronic apparatus according to the present invention will now be described with reference to FIGS. 8 and 9. FIG. 8 is a view showing a case where the drip-proof structure of the present invention is applied to modules 5 of an I/O unit 4. FIG. 9 is a view showing a case where the drip-proof structure of the present invention is applied to a base unit 6 of the I/O unit 4.

As shown in FIG. 8, a drip-proof structure section 15 provided to a housing 7 for the modules 5 is inclined downward from a top portion 20 as an apex above an uppermost portion 19 of a module-side opening 14 so as to be kept apart from the opening 14. Thus, a liquid (in a flow denoted by numeral 23 in FIG. 8) that has reached the drip-proof structure section 15 easily flows down along the inclination without staying there.

Likewise, as shown in FIG. 9, a drip-proof structure section 17 provided to a housing 8 for the base unit 6 is inclined downward from a top portion 22 as an apex above an uppermost portion 21 of the base-unit-side opening 16 so as to be kept apart from the opening 16. Thus, the liquid (in a flow denoted by numeral 23 in FIG. 9) that has reached the drip-proof structure section 17 easily flows down along the inclination without staying there.

A fourth embodiment of the drip-proof structure of an electronic apparatus according to the present invention will now be described with reference to FIGS. 10 and 11. In this embodiment, a drip-proof structure section 17 surrounding a connector opening is provided only on a housing 8 for the base unit 6, or a drip-proof structure section 15 surrounding a connector opening is provided only on a housing 7 for modules 5.

Figure 10:
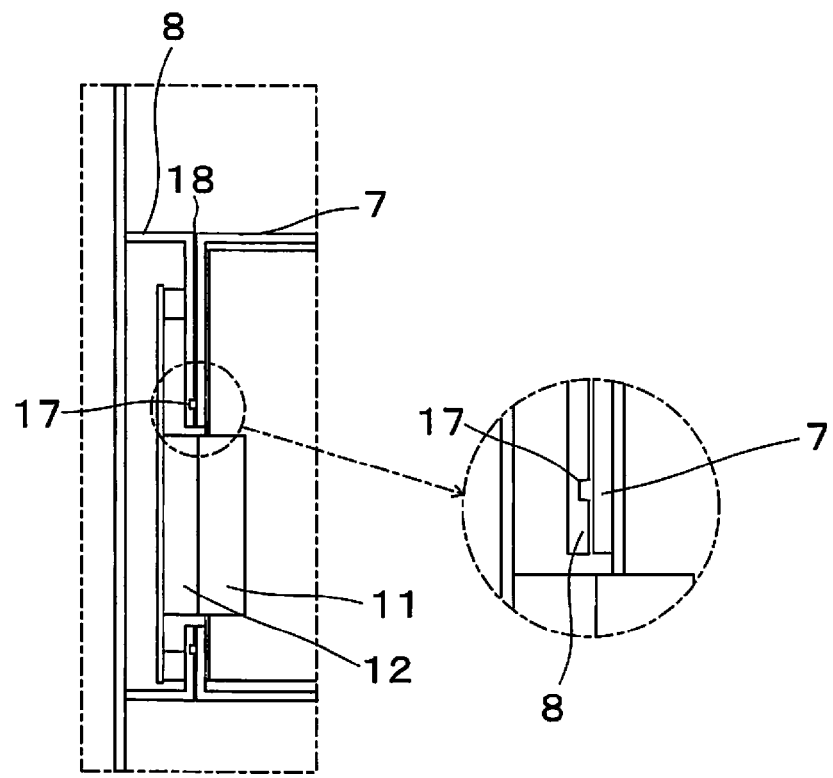
FIG. 10 is a view showing a fourth embodiment of the drip-proof structure according to the present invention in which a drip-proof structure section surrounding a connector opening is provided only on a housing for a base unit.
Figure 11:
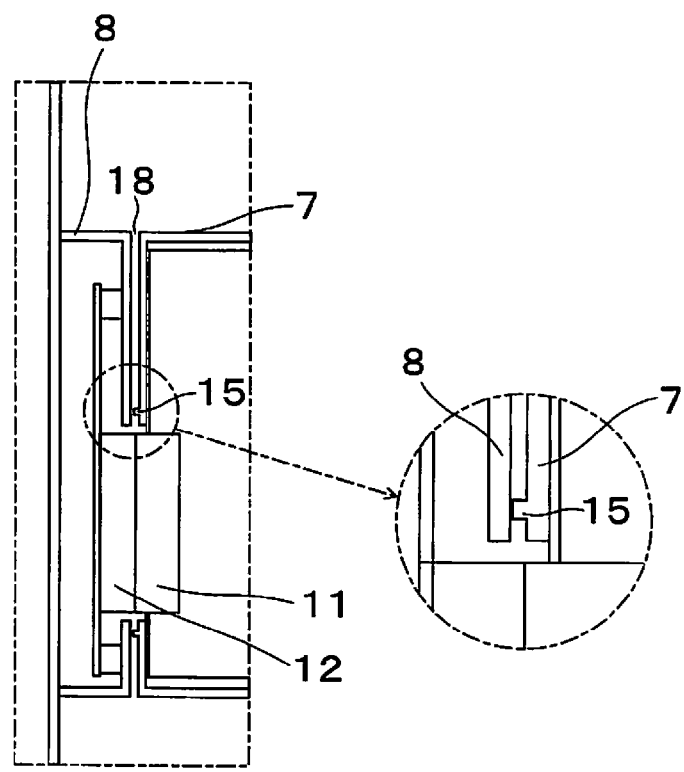
FIG. 11 is a view showing the fourth embodiment of the drip-proof structure according to the present invention in which the drip-proof structure section surrounding the connector opening is provided only on a housing for modules.

FIG. 10 is a view showing a configuration in which a concave portion as the drip-proof structure section 17 surrounding the base-unit-side opening 16 is provided on the housing 8 for the base unit 6. FIG. 11 is a view showing a configuration in which a convex portion as the drip-proof structure section 15 surrounding the module-side opening 14 is provided on the housing 7 for the modules 5.

In the present invention, as described in connection with the above embodiments, the drip-proof structure section or sections (concave portion and/or convex portion) are provided around the connector opening (module-side opening 14) of the housing 7 for the modules 5 and/or the connector opening (base-unit-side opening 16) of the housing 8 for the base unit 6. When the liquid or the cutting fluid is introduced into the housing of the electronic apparatus or the I/O unit 4, therefore, it is induced to flow along the shape of the drip-proof structure section(s). Thus, possibility of the liquid dripping and spreading on the connector that electrically connect the units can be considerably reduced.

Further, the module 5 or the base unit 6 is provided with the means for pressure-welding the drip-proof structure section 15 (concave portion and/or convex portion) provided to the housing 7 for the modules 5 and the housing 8 for the base unit 6, pressure-welding the housing 7 for the modules 5 and the drip-proof structure section 17 (concave portion and/or convex portion) provided to the housing 8 for the base unit 6, or pressure-welding the drip-proof structure section 15 and the drip-proof structure section 17, to each other when the module 5 and the base unit 6 are connected by the connectors. Thus, there is no gap between the units, so that penetration of the liquid to the connector side can be made more difficult than in the case where the drip-proof structure sections are only provided to surround the openings for the connectors.

Furthermore, the drip-proof structure section 15 (concave portion and/or convex portion) provided to the housing 7 for the modules 5 and the drip-proof structure section 17 (concave portion and/or convex portion) provided to the housing 8 for the base unit 6 are each inclined downward from the top portion as the apex above the uppermost portion of the connector opening. Thus, the liquid that has reached the drip-proof structure sections 15 and 17 can be made to flow down easily along the inclination so as to be kept apart from the opening.

The invention claimed is:

1. A drip-proof structure of an electronic apparatus, the drip-proof structure comprising:
   a module having
      a first printed circuit board,
      a first electronic component and a first connector which are mounted on the first printed circuit board, and
      a first housing which houses therein the first printed circuit board; and
   a base unit having
      a second printed circuit board,
      a second electronic component and a second connector which are mounted on the second printed circuit board, and
      a second housing which houses therein the second printed circuit board,
   wherein
   the module and the base unit are connected for operation by the first and second connectors,
   the first housing and the second housing are provided with corresponding first and second connector openings for the first and second connectors, respectively,
   the first housing further comprises, for the first connector opening, a first drip-proof structure section formed of a first concave portion recessed from a first wall surface of the first housing, and
   the second housing further comprises, for the second connector opening, a second drip-proof structure section formed of a second concave portion recessed from a second wall surface of the second housing.

2. The drip-proof structure according to claim 1, wherein the first drip-proof structure section surrounds the first connector opening in the first housing, and is in a shape of a roof inclined downward so as to be kept apart from the first connector opening, as viewed toward a mounting surface for the first connector, and
   the second drip-proof structure section surrounds the second connector opening in the second housing, and is in a shape of a roof inclined downward so as to be kept apart from the second connector opening, as viewed toward a mounting surface for the second connector.

* * * * *